US010256877B2

(12) United States Patent
Rao et al.

(10) Patent No.: US 10,256,877 B2
(45) Date of Patent: Apr. 9, 2019

(54) APPARATUS AND METHODS FOR BEAM REFINEMENT

(71) Applicant: QUALCOMM Incorporated, San Diego, CA (US)

(72) Inventors: Sandeep Rao, San Diego, CA (US); Defang Chen, San Diego, CA (US); Shan Qing, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/667,521

(22) Filed: Aug. 2, 2017

(65) Prior Publication Data

US 2019/0044578 A1    Feb. 7, 2019

(51) Int. Cl.
*H04B 1/00* (2006.01)
*H04B 7/0426* (2017.01)
*H03G 3/30* (2006.01)
*H03F 1/32* (2006.01)
*H04B 7/26* (2006.01)

(52) U.S. Cl.
CPC .......... *H04B 7/043* (2013.01); *H03G 3/3047* (2013.01); *H03F 1/3247* (2013.01); *H04B 7/2618* (2013.01); *H04B 7/2621* (2013.01)

(58) Field of Classification Search
CPC ....... H04B 7/0617; H04B 7/04; H04W 4/027; G01S 7/484; G01S 7/52095

USPC ....................................................... 455/63.4
See application file for complete search history.

(56) References Cited

U.S. PATENT DOCUMENTS

| 6,453,177 | B1 | 9/2002 | Wong et al. | |
|---|---|---|---|---|
| 7,046,965 | B2 | 5/2006 | Maeda et al. | |
| 9,478,857 | B2 | 10/2016 | Chang et al. | |
| 2013/0040655 | A1 | 2/2013 | Keidar | |
| 2014/0225775 | A1* | 8/2014 | Clevorn | H01Q 3/34 |
| | | | | 342/372 |
| 2016/0043792 | A1 | 2/2016 | Jeong et al. | |
| 2016/0066197 | A1 | 3/2016 | Park et al. | |
| 2016/0165458 | A1 | 6/2016 | Peng et al. | |
| 2017/0041811 | A1* | 2/2017 | Qiao | H04W 16/28 |
| 2018/0009526 | A1* | 1/2018 | Spengler | B64C 39/024 |

OTHER PUBLICATIONS

International Search Report and Written Opinion—PCT/US2018/039321—ISA/EPO—Aug. 27, 2018.

* cited by examiner

*Primary Examiner* — Tu X Nguyen
(74) *Attorney, Agent, or Firm* — Arent Fox LLP

(57) ABSTRACT

The apparatus may be an apparatus for wireless communication. The apparatus for wireless communication may include a processing system. The processing system may manage an antenna beam. The processing system may be configured to monitor a parameter of a signal and widen the antenna beam of the apparatus for wireless communication when the parameter falls below a threshold.

19 Claims, 11 Drawing Sheets

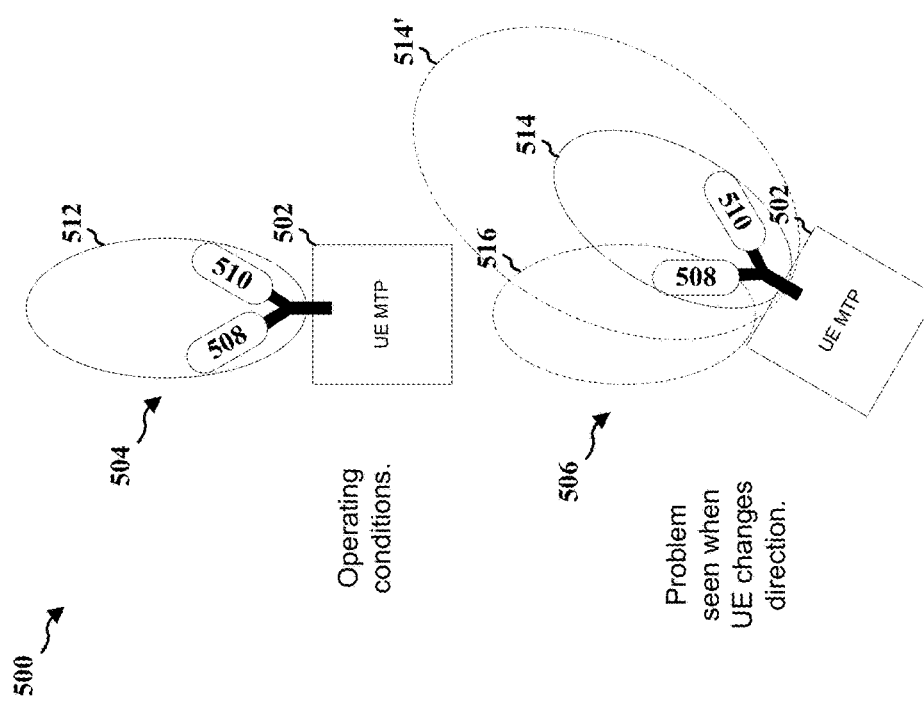

APPARATUS AND METHODS FOR BEAM REFINEMENT

BACKGROUND

Field

The present disclosure relates generally to communication systems, and more particularly, to beam refinement on communication devices.

Background

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

Movement by a UE in a straight line and/or rotating about, e.g., an axis of the UE, may cause the UE to move out of an area of coverage of an antenna beam used for communication with the UE. The movement out of an area of coverage of an antenna beam may be relatively rapid because the UE may be in a high mobility scenario. When the UE takes more time to decide which antenna beam will provide the best receive signal, e.g., the highest SNR, the delay may cause a radio link failure (RLF) when the UE does not switch to a new beam quickly enough.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

As discussed above, when a UE is moving linearly and/or rotating, the movement (linear and/or rotation) may cause the UE to move outside of an area of coverage of a beam such that the UE is no longer within the area of coverage of a beam, e.g., a receive beam from a base station or a receive beam from another UE. A UE may move out of an area of coverage (e.g., of a base station's beam) may occur rapidly. When the UE takes too much time to decide which beam will provide the best receive signal, e.g., the highest SNR, in a high mobility scenario, the delay may cause a RLF because the UE may not switch to a new beam quickly enough before moving out of the current beam's coverage area.

According to aspects of the disclosure, an apparatus, system, and method may be configured to increase beam width before changing directions of the beams or changing to a different beam direction to avoid beam switching, which may be computationally intensive and time consuming. Delays in beam switching may lead to RLFs. By increasing beam width first, an example UE may reduce the number of beam switches. Having fewer beam switches, may be less computationally intensive as compared to having more beam switches. Accordingly, increasing beam width may lead to fewer RLFs. Some aspects of these systems and methods may result in a slight drop in SNR. A slight drop in SNR may be more acceptable as compared to a RLF in cases of increased UE mobility.

In an aspect of the disclosure, a method, a computer-readable medium, and an apparatus are provided. The apparatus may be an apparatus for wireless communication. The apparatus for wireless communication may include a processing system. The processing system may manage an antenna beam. The processing system may be configured to monitor a parameter of a signal and widen the antenna beam of the apparatus for wireless communication when the parameter does not satisfy a threshold.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIG. 5 is a diagram illustrating UE transmission patterns.

DETAILED DESCRIPTION

Figure 1:
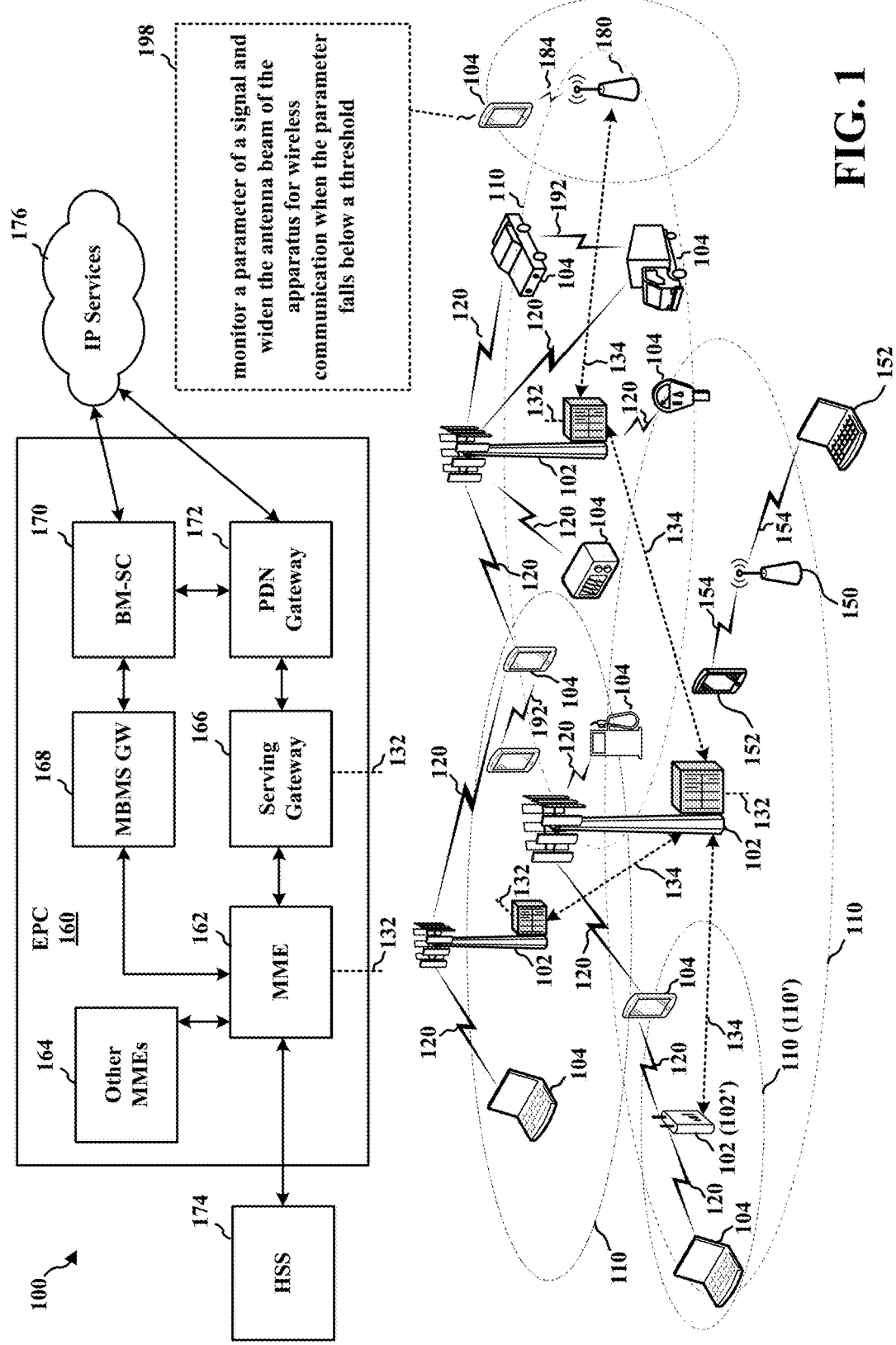
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, and an Evolved Packet Core (EPC) 160. The base stations 102 may include macro cells (high power cellular base station) and/or small cells (low power cellular base station). The macro cells include base stations. The small cells include femtocells, picocells, and microcells.

The base stations 102 (collectively referred to as Evolved Universal Mobile Telecommunications System (UMTS) Terrestrial Radio Access Network (E-UTRAN)) interface with the EPC 160 through backhaul links 132 (e.g., S1 interface). In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the geographic coverage area 110 of one or more macro base stations 102. A network that includes both small cell and macro cells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100 MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 192. The D2D communication link 192 may use the DL/UL WWAN spectrum. The D2D communication link 192 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, LTE, or NR.

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/Wi-fi AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

The gNodeB (gNB) 180 may operate in millimeter wave (mmW) frequencies and/or near mmW frequencies in communication with the UE 104. When the gNB 180 operates in mmW or near mmW frequencies, the gNB 180 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 180 may utilize beamforming 184 with the UE 104 to compensate for the extremely high path loss and short range.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The base station may also be referred to as a gNB, Node B, evolved Node B (eNB), an access point, a base transceiver station, a radio base station, a radio transceiver, a transceiver function, a basic service set (BSS), an extended service set (ESS), or some other suitable terminology. The base station 102 provides an access point to the EPC 160 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a toaster, or any other similar functioning device. Some of the UEs 104 may be referred to as IoT devices (e.g., parking meter, gas pump, toaster, vehicles, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 1, in certain aspects, the UE 104 may be configured to manage an antenna beam. For example, a processing system and/or other circuitry in the UE 104 may be configured to monitor a parameter of a signal and widen the antenna beam of the apparatus for wireless communication when the parameter does not satisfy a threshold (198).

Figure 2:
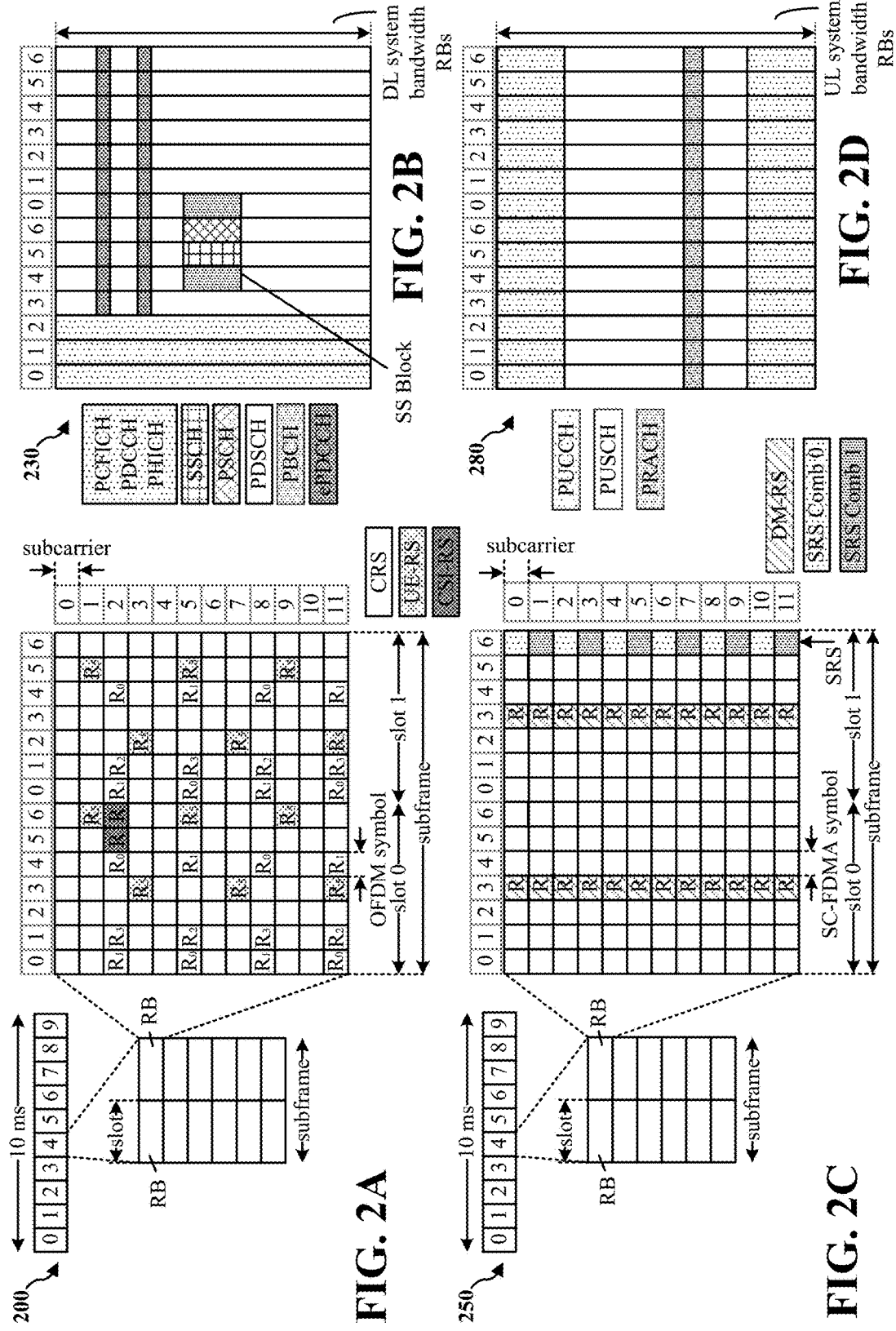
FIGS. 2A, 2B, 2C, and 2D are diagrams illustrating examples of a DL frame structure, DL channels within the DL frame structure, an UL frame structure, and UL channels within the UL frame structure, respectively.

FIG. 2A is a diagram 200 illustrating an example of a DL frame structure. FIG. 2B is a diagram 230 illustrating an example of channels within the DL frame structure. FIG. 2C is a diagram 250 illustrating an example of an UL frame structure. FIG. 2D is a diagram 280 illustrating an example of channels within the UL frame structure. Other wireless communication technologies may have a different frame structure and/or different channels. A frame (10 ms) may be divided into 10 equally sized subframes. Each subframe may include two consecutive time slots. A resource grid may be used to represent the two time slots, each time slot including one or more time concurrent resource blocks (RBs) (also referred to as physical RBs (PRBs)). The resource grid is divided into multiple resource elements (REs). For a normal cyclic prefix, an RB may contain 12 consecutive subcarriers in the frequency domain and 7 consecutive symbols (for DL, OFDM symbols; for UL, SC-FDMA symbols) in the time domain, for a total of 84 REs. For an extended cyclic prefix, an RB may contain 12 consecutive subcarriers in the frequency domain and 6 consecutive symbols in the time domain, for a total of 72 REs. The number of bits carried by each RE depends on the modulation scheme.

As illustrated in FIG. 2A, some of the REs carry DL reference (pilot) signals (DL-RS) for channel estimation at the UE. The DL-RS may include cell-specific reference signals (CRS) (also sometimes called common RS), UE-specific reference signals (UE-RS), and channel state information reference signals (CSI-RS). FIG. 2A illustrates CRS for antenna ports 0, 1, 2, and 3 (indicated as $R_0$, $R_1$, $R_2$, and $R_3$, respectively), UE-RS for antenna port 5 (indicated as $R_5$), and CSI-RS for antenna port 15 (indicated as R).

FIG. 2B illustrates an example of various channels within a DL subframe of a frame. The physical control format indicator channel (PCFICH) is within symbol 0 of slot 0, and carries a control format indicator (CFI) that indicates whether the physical downlink control channel (PDCCH) occupies 1, 2, or 3 symbols (FIG. 2B illustrates a PDCCH that occupies 3 symbols). The PDCCH carries downlink control information (DCI) within one or more control channel elements (CCEs), each CCE including nine RE groups (REGs), each REG including four consecutive REs in an OFDM symbol. A UE may be configured with a UE-specific enhanced PDCCH (ePDCCH) that also carries DCI. The ePDCCH may have 2, 4, or 8 RB pairs (FIG. 2B shows two RB pairs, each subset including one RB pair). The physical hybrid automatic repeat request (ARQ) (HARQ) indicator channel (PHICH) is also within symbol 0 of slot 0 and carries the HARQ indicator (HI) that indicates HARQ acknowledgement (ACK)/negative ACK (HACK) feedback based on the physical uplink shared channel (PUSCH). The primary synchronization channel (PSCH) may be within symbol 6 of slot 0 within subframes 0 and 5 of a frame. The PSCH carries a primary synchronization signal (PSS) that is used by a UE 104 to determine subframe/symbol timing and a physical layer identity. The secondary synchronization channel (SSCH) may be within symbol 5 of slot 0 within subframes 0 and 5 of a frame. The SSCH carries a secondary synchronization signal (SSS) that is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DL-RS. The physical broadcast channel (PBCH), which carries a master information block (MIB), may be logically grouped with the PSCH and SSCH to form a synchronization signal (SS) block. The MIB provides a number of RBs in the DL system bandwidth, a PHICH configuration, and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry demodulation reference signals (DM-RS) for channel estimation at the base station. The UE may additionally transmit sounding reference signals (SRS) in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various channels within an UL subframe of a frame. A physical random access channel (PRACH) may be within one or more subframes within a frame based on the PRACH configuration. The PRACH may include six consecutive RB pairs within a subframe. The PRACH allows the UE to perform initial system access and achieve UL synchronization. A physical uplink control channel (PUCCH) may be located on edges of the UL system bandwidth. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
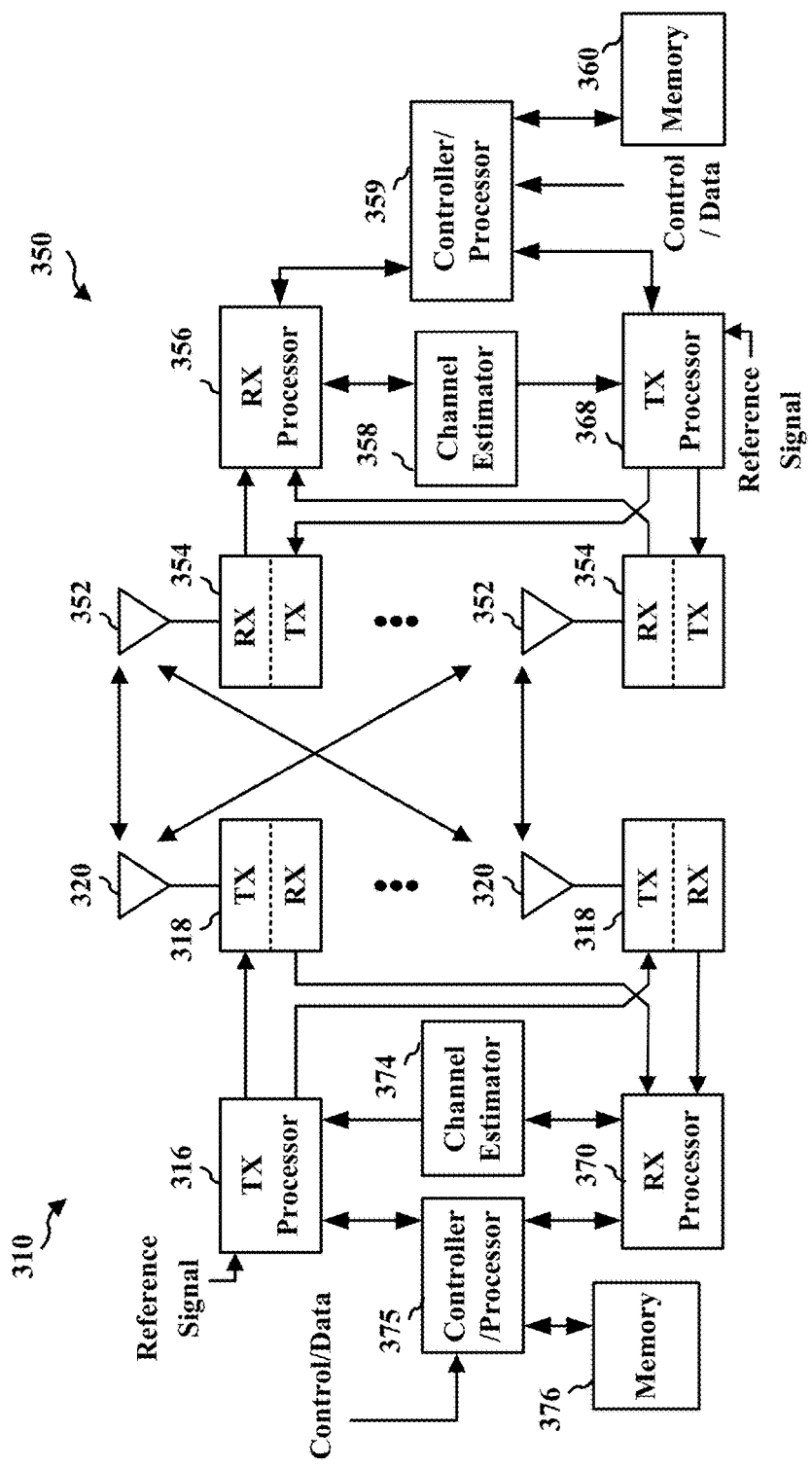
FIG. 3 is a diagram illustrating an example of a base station and user equipment (UE) in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

Figure 4:
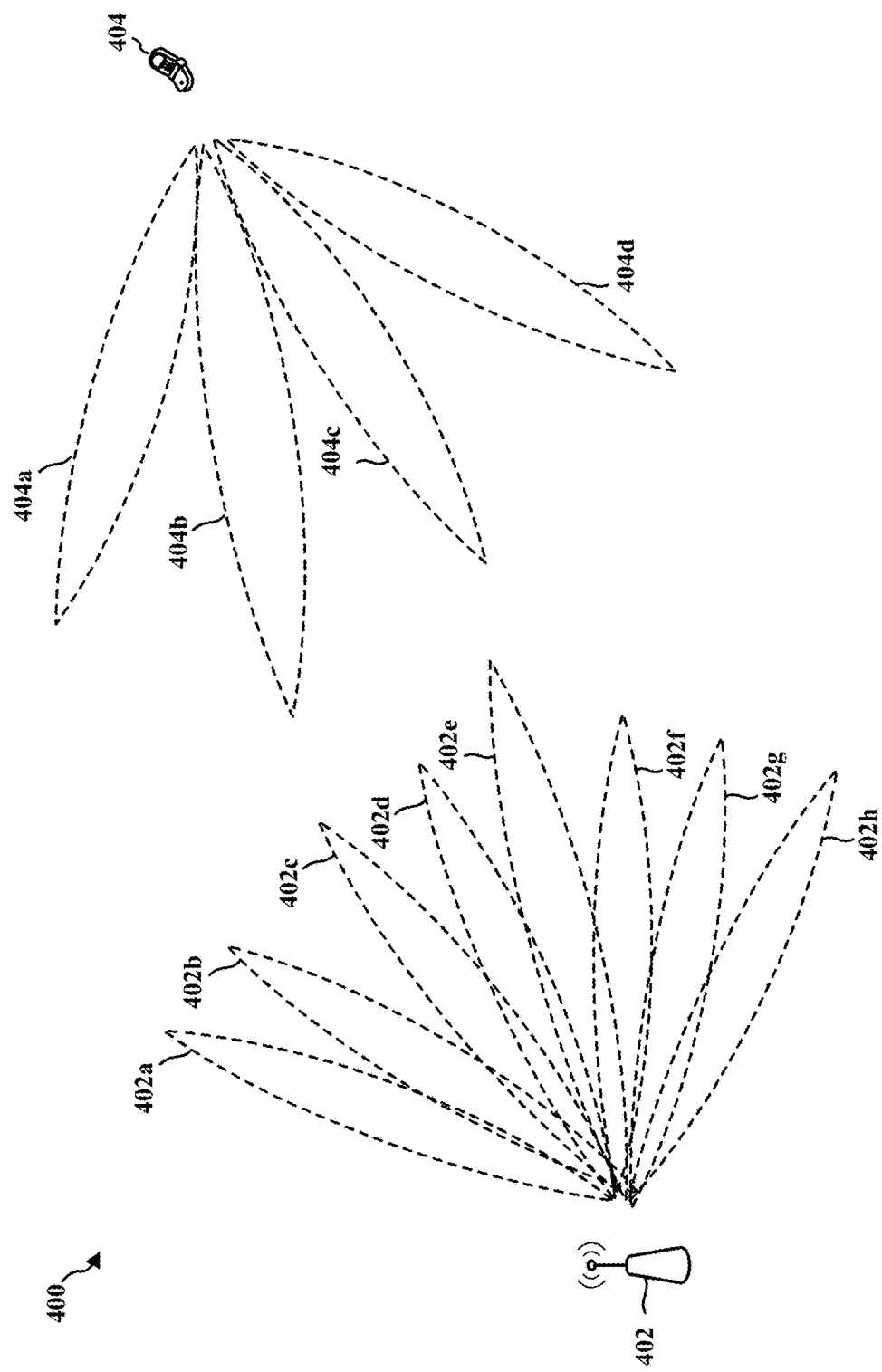
FIG. 4 is a diagram illustrating a base station in communication with a UE.

FIG. 4 is a diagram 400 illustrating a base station 402 in communication with a UE 404. Referring to FIG. 4, the base station 402 may transmit a beamformed signal to the UE 404 in one or more of the directions for beams 402a, 402b, 402c, 402d, 402e, 402f, 402g, 402h. The UE 404 may receive the beamformed signal from the base station 402 in one or more receive directions for beams 404a, 404b, 404c, 404d. The UE 404 may also transmit a beamformed signal to the base station 402 in one or more of the directions for beams 404a-404d. The base station 402 may receive the beamformed signal from the UE 404 in one or more of the receive directions for beams 402a-402h. The base station 402/UE 404 may perform beam training to determine the best receive and transmit directions for each of the base station 402/UE 404. The transmit and receive directions for the base station 402 may or may not be the same. The transmit and receive directions for the UE 404 may or may not be the same.

In an aspect, as the UE 404 moves, the UE 404 changes location relative to a beam coverage area of the transmit beam from the base station 402 and the direction of the beam received by the UE 404 to the base station 402 changes resulting in the coverage area of the beam relative to the base station to change as well (the beam may have a same size coverage area but is no longer aligned with the base station). For example, initially, beam 402e and beam 404c may overlap. The overlap may decrease or may no longer exists due to movement of the UE 404. Accordingly, the SNR of a beam pair (e.g., 402e, 404c) used for communication may degrade. Broadening or widening the beams (e.g., 402e, 404c) may keep the UE 404 and base station 402 within the coverage area of the beam pair (e.g., 402e, 404c) longer. When broadening or widening the beam (e.g., 402e, 404c) does not keep the UE 404 and the base station 402 within the coverage area, a new beam pair may be selected. For example, if the UE rotates counter clockwise (relative to the illustration on the page of FIG. 4) a beam pair (e.g., 402e, 404b) may be selected. Generally, the area of coverage of the base station 402 beam does not change as UE 404 moves, rather, the UE 404 may move outside of the beam coverage area. Likewise the beam coverage area of the UE 404 beam changes direction which may mean the base station 402 is no longer within the beam coverage area.

FIG. 5 is a diagram 500 illustrating a UE 502 having transmission patterns 504, 506 and a base station 550 having an antenna pattern 552. In an example, a multi-path transport protocol (MTP) may operate in a data transfer mode with a number, N, UE receive beams 508, 510. FIG. 5 illustrates a simplified example having two UE receive beams 508, 510. The N UE receive beams 508, 510 of the UE 502 form an area of coverage 512, 514 (which may also be referred to as a "coverage area"). The two UE receive beams 508, 510 may work in tandem to form the area of coverage 512, 514. Other examples may use more than two UE beams. The number of UE transmission beams may be based on an RF configuration for a particular UE.

When a UE 502 is moving linearly and/or rotating, the movement (linear and/or rotation) may cause an area of coverage 512, 514 to change, e.g., from the area of coverage 512 to the area of coverage 514. Accordingly, an area of coverage 514 may not align with the direction of a receive beam 516, e.g., a direction from which transmission beams from a base station or another UE are received, e.g., in the same direction as base station 550 antenna pattern 552. The change to the area of coverage 512, 514 may change continuously. Additionally, the changes to the area of coverage 512, 514 may occur rapidly. Accordingly, one or more beams 508, 510 may need to change to accommodate the changing areas of coverage 512, 514. In an example, beams may be RF device configuration, In an example, hardware, software, firmware, or some combination of each may manage RF control of the UE 502. For example, layer 1 control software may manage RF control of the UE 502. The hardware, software, or some combination of these, e.g., the layer 1 control software, may perform beam switches to manage a consistently changing overlap of areas of coverage, e.g., the coverage areas of the receive beam and transmit beams. The beam switching may provide for better performance, e.g., higher signal-to-noise ratio (SNR). For example, an area of coverage 514 may be switched to match the receive beam 516 so that the base station 550 antenna beam coverage area (e.g., of antenna pattern 552) matches the UE receive beam coverage area (receive beam 516) to align with the base station transmit beam coverage area of receive beam 516 or at least achieves a higher degree of overlap which may, for example, increases SNR. In an aspect, it may be desirable for the area of coverage 514 to match or nearly match the receive beam 516 so that a signal may be received with an increased SNR. When layer 1 takes more time to decide which beam will provide the best SNR in a high mobility scenario, then the delay in switching beams may cause a RLF.

An aspect may include hardware, software, firmware, or some combination that implements a beam management algorithm controlling an RF device, e.g., a UE. For example, layer 1 control software may implement a beam management algorithm controlling the UE 502. In an example including N beams, beam management hardware, software, firmware, or some combination of these ("the beam manager"), such as layer 1 beam manager software may receive N separate measurement results. One result may be received for each of the N beams. When measurement result for one or more of the N beams does not satisfy a certain threshold, the beam manager may implement one or more of multiple options to rectify the problem. In some examples, the actions of the beam manager may prevent (or reduce the chances of) a RLF. For example, the beam manager may adjust the direction of the beam(s) or coverage area of beam(s). A beam manager, such as a layer 1 beam manager, may have knowledge of all the different beams that may be supported by the UE. For example, the beam manager may have knowledge of beams including narrower beams, wider beams, and beams in all directions. Adjusting the direction of a beam may result in keeping an area of coverage 512 the same or nearly the same, e.g., as a receive beam 516. Accordingly, a UE 502 may keep the same area of coverage 512 but in a different direction relative to the UE 502, which may have changed location and/or orientation. In an aspect a beam direction may be changed by steering the beam. For example, signals to an antenna array may be varied to change or steer the direction of the beam. In another aspect, beam direction may be changed by switching from one antenna beam to another antenna beam, e.g., by switching to an antenna having a different beam direction.

Adjusting an area of coverage 514 (e.g., widening and/or narrowing an area of coverage 514') by adjusting the beam 508, 510 may result in a same overall direction but a change in SNR. Using the systems and methods described herein, a UE may select a suitable beam 508, 510, including a direction of the beam 508, 510, and/or a width of the beam 508, 510, that may provide an area of coverage 512 for continued operation in cases of high mobility. For example, the area of coverage 514 of the receive beam of the UE may be widened and/or the direction of the area of coverage of the receive beam may be changed to overlap with the receive beam 516, for example, to achieve sufficient SNR.

In an aspect, a UE may widen an existing beam 508, 510 to reduce an overall time needed for an area of coverage 512, 514 to settle with a newer set of refined beams for better SNR to extend the area of coverage 512, 514. For example, a UE may increase a beam width to rather than perform a switch of beams, which may be more time consuming than widening the beam. The UE 502 may then run a refinement procedure on the wider beam to narrow in on a preferred area of coverage 512. The systems and methods described herein may provide for easier tracking of a change in direction. As the UE 502 begins moving, e.g., linearly and/or rotationally, the UE 502 may keep widening a beam or beams the UE 502 is using to accommodate any changes in direction. Once a UE has reached the widest possible beams, e.g., the widest beam a UE may generate or may be set to generate for given conditions, based on limitations of the UE, limits in acceptable transmit power, or other aspects of the UE, the UE 502 may switch directions, e.g., beam switch, to accommodate the movement of the UE 502. When the UE 502 stops moving, the refinement algorithm may be used to improve a signal, e.g., by attempting to maximize the SNR of a received signal (or some other figure of merit) by refining the current beams 508, 510.

An aspect may be configured to increase beam width, e.g., incrementally, to the widest possible beams before changing directions of the beams. Beam switching may be computationally intensive and time consuming, for example, a beam switch may require a beam training procedure or other overhead procedures to be performed. Accordingly, delays in beam switching, e.g., performing a beam switch to another beam pair. may lead to RLFs. By increasing beam width first, a UE may reduce the number of beam switches due to mobility. Moving to a wider beam earlier on, may result in fewer beam switches (e.g., changing antenna elements) as compared to a UE that changes directions on a narrow refined beam as the UE moves and/or rotates. Use of a narrow beam on the UE may result in rapidly triggering more beam switches. The number of beam switches may increase for a moving and/or rotating UE as a beam, e.g., a receive beam, of the UE is narrowed because the coverage area is smaller and results in reduced overlap of transmit and receive beam coverage areas. Having fewer beam switches, may be less computationally intensive as compared to having more beam switches. Accordingly, increasing beam width may lead to fewer RLFs. Some aspects of these systems and methods may result in a slight drop in SNR, e.g., because wider beams may transmit lower power for a given area. A slight drop in SNR may be more acceptable as compared to a RLF in cases of higher mobility.

Figure 6A:
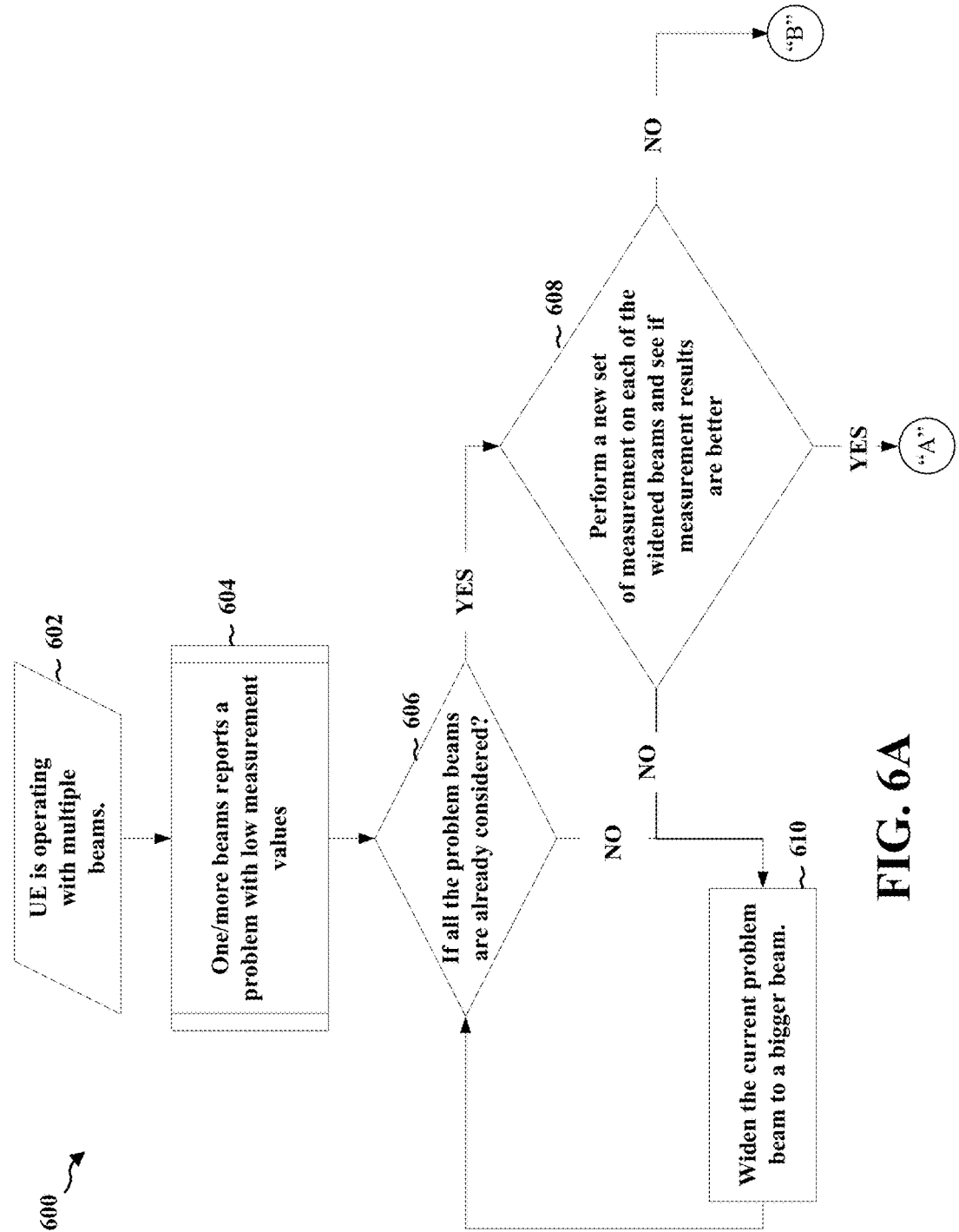
FIGS. 6A-6C illustrate a flowchart of a method of wireless communication.
Figure 6B:
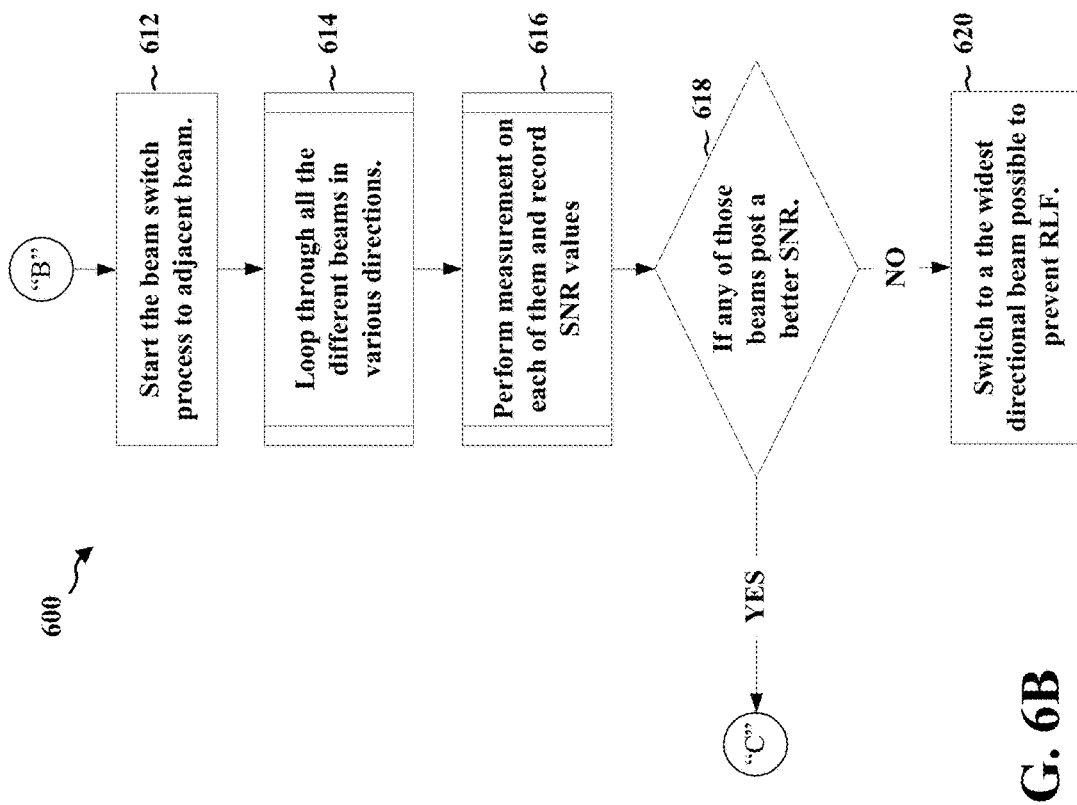
Figure 6C:
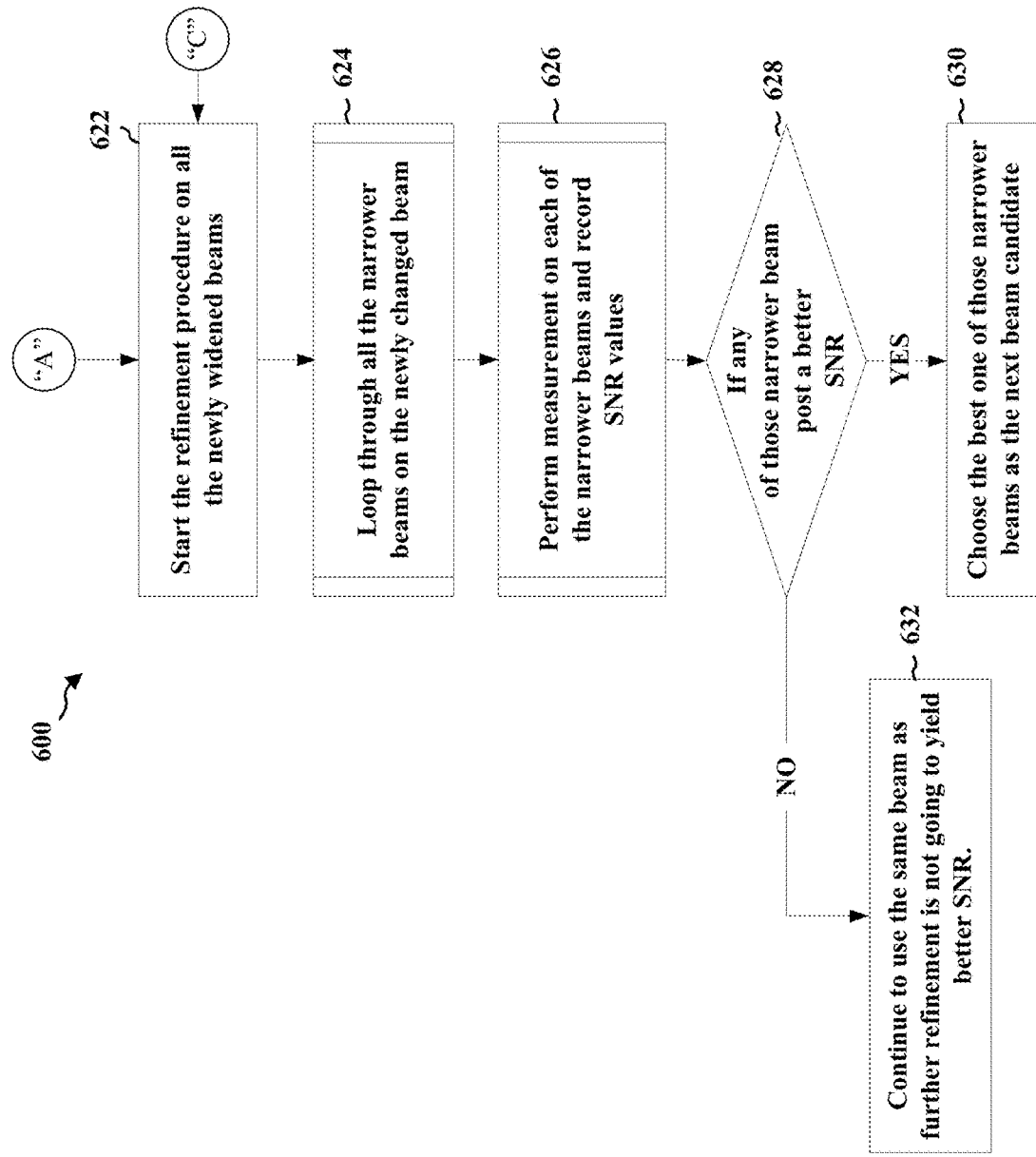

FIGS. 6A-6C illustrate a flowchart of a method of wireless communication. The method may be performed by a UE (e.g., the UE 104, 350, 404, 502, the apparatus 802/802'). At 602, the UE is operating with multiple beams to communicate with, e.g., a base station or other electronic device(s). For example, the UE (e.g., the UE 104, 350, 404, 502 the apparatus 802/802') may be operating with multiple beams (508, 510).

At 604, the UE may report a problem with low measurement values of certain parameters for one or more beams. For example, the UE (e.g., the UE 104, 350, 404, 502 the apparatus 802/802') may report a problem with low measurement values (e.g., SNR) for one or more beams (508, 510). For example, a monitoring component may determine quality of a received signal by measuring parameters of the received signal such as SNR, SNIR, SIR, PSNR, SINR, or BER, or other figures of merit as described herein (See, e.g., monitoring component 808, FIGS. 8-9.). For example, the monitoring component may determine quality of a received signal by measuring parameters the current receive antenna beams.

Figure 8:
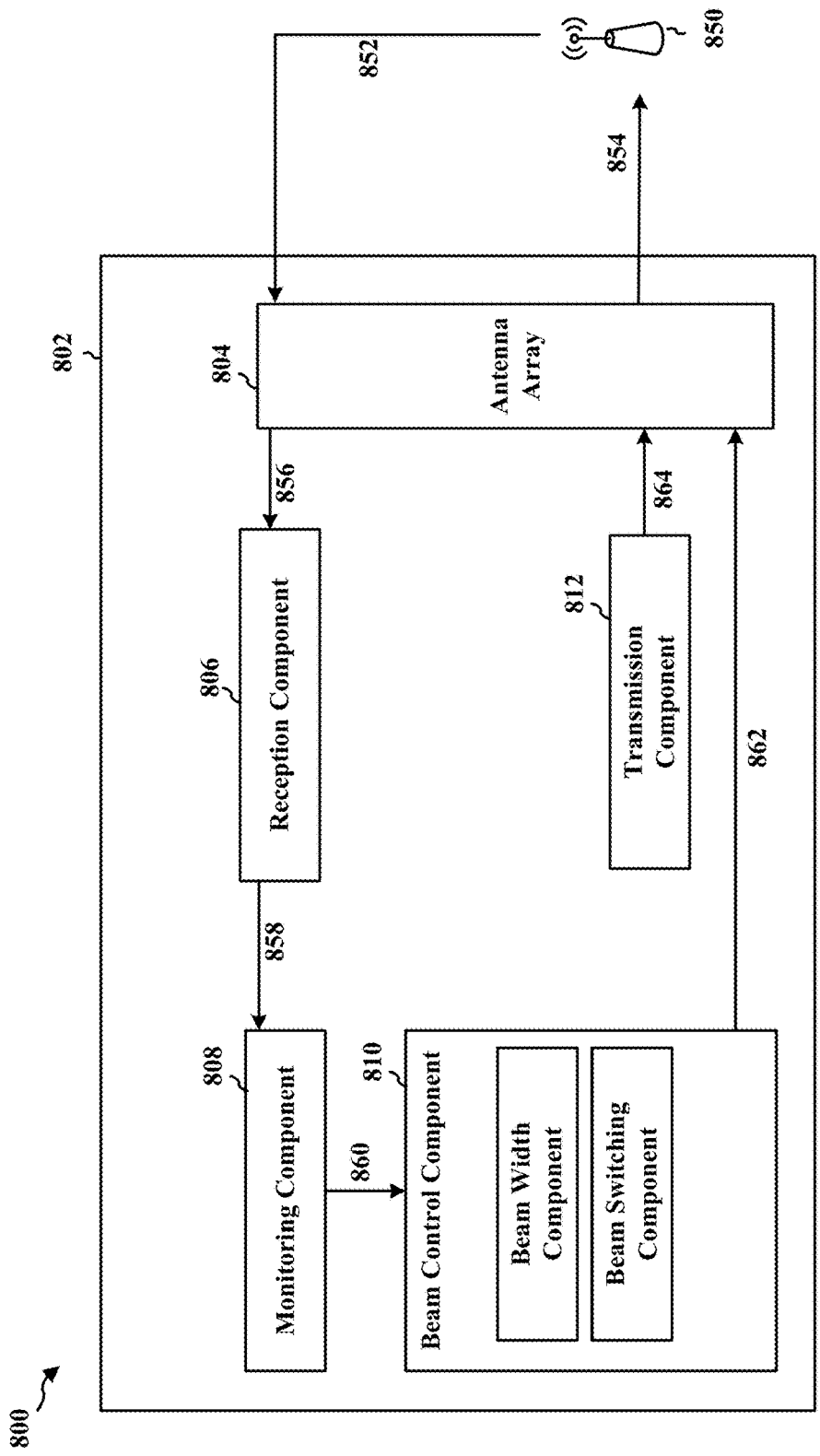
FIG. 8 is a conceptual data flow diagram illustrating the data flow between different means/components in an exemplary apparatus.
Figure 9:
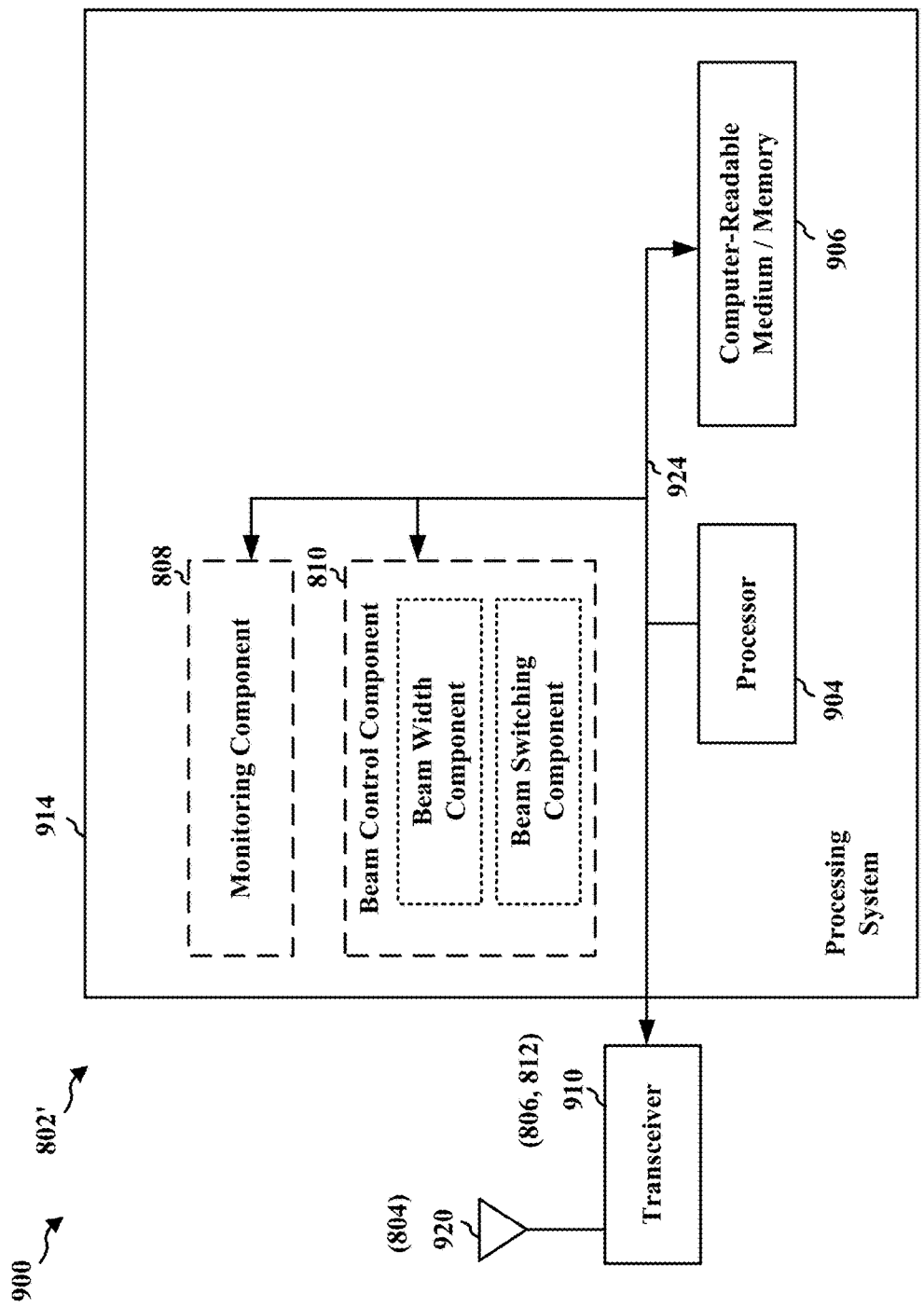
FIG. 9 is a diagram illustrating an example of a hardware implementation for an apparatus employing a processing system.

At 606, the UE may determine when all the problem beams (e.g., beams with low SNR) are already considered, e.g., when step 604 has already been performed across each possible beam. For example, the UE (e.g., the UE 104, 350, 404, 502 the apparatus 802/802') may determine when all the problem beams are already considered. For example, a processor (356; 368; 359; FIGS. 8-9, 808; 810, FIG. 9; 904) in the UE (e.g., the UE 104, 350, 404, 502 the apparatus 802/802') may determine when all the problem beams are already considered. For example, a UE may keep track of when step 604 has been performed for each possible beam.

When all of the problem beams have been considered (606), at 608, the UE may perform a new set of measurements on each of the widened beams to determine if measurement results on the widened beams are better than narrower beams. For example, a processor in the UE (e.g., RX processor 356; TX processor 368; controller/processor 359; FIG. 9; 904) or a component (e.g., FIGS. 8-9, monitoring component 808; beam control component 810) may perform a new set of measurements (e.g., with monitoring component 808, FIGS. 8-9) on each of the widened beams and see if measurement results are better than the narrower beams.

At 610, when all of the problem beams have not been considered (606), the UE may widen the current problem beam to a wider beam, e.g., a beam with a wider coverage area. The wider coverage area may allow for continued coverage for a longer period without a beam switch. In an aspect, beam widening may be limited by one or more of the antenna or antenna array of a particular UE, limits on transmit power of the UE, SNR for a given beam width, or any other factors that impact beam width of a UE. In some aspects, UEs may have the same or similar maximum beam widths. In other aspect, beam widths may vary between UEs based on the design of a particular UE, the orientation of a particular UE (maximum beam width may vary with transmit or receive direction from/to the UE), transmit power of the UE, or other factors. For example, the UE (356; 368; 359; FIGS. 8-9, 808; 810, FIG. 9; 904) may widen the current problem beam (e.g., beam 510) to a wider beam.

At 622, when the results (608) are better ("A"), the UE may start the refinement procedure on all the newly widened beams. For example, when the results (608) are better, based on a figure of merit, such as SNR, the UE (356; 368; 359; FIGS. 8-9, 808; 810, FIG. 9; 904) may start the refinement procedure on all the newly widened beams. For example, the UE may refine each widened antenna beam when the parameter for the widened beam satisfies the threshold. The direction and/or width of the beam may be systematically changed and measured to determine a narrower beam with a better SNR ratio or a better other figure of merit than the SNR or figure of merit of the widened antenna beam.

At 612, when the results of a measurement of a figure of merit or measurements of figures of merit of a received signal (608) are not better than a measurement of a figure of merit or figures of merit of a narrower beam ("B"), the UE may start a beam switch process to an adjacent beam. For example, when the results (608) are not better ("B"), at 612, the UE (356; 368; 359; FIGS. 8-9, 808; 810, FIG. 9; 904) may start a beam switch procedure to an adjacent beam.

At 614, the UE may loop through all the different beams in various directions.

For example, the UE (356; 368; 359; FIGS. 8-9, 808; 810, FIG. 9; 904) may loop through all the different beams 508, 510 in various directions, e.g., as part of aa procedure to determine each beam SNR (e.g., at 616).

At 616, the UE may perform measurements on each of the beams and record SNR values (or other measurement values or figures of merit). For example, the UE (356; 368; 359; FIGS. 8-9, 808; 810, FIG. 9; 904) may perform one or more measurements on each of the beams 508, 510 and record SNR values (or other measurement values of a figure of merit).

At 618, the UE may determine whether any of the beams have a better SNR (or other figure of merit). For example, the UE (356; 368; 359; FIGS. 8-9, 808; 810, FIG. 9; 904) may determine whether any of the beams have a better SNR (or other figure of merit).

At 620, when none of the beams have a better SNR (or other figure of merit), the UE may switch to a widest directional beam possible. For example, the UE (356; 368; 359; FIGS. 8-9, 808; 810, FIG. 9; 904) may switch to a widest directional beam possible, e.g., the widest beam possible for a current beam. Switching to the widest beam possible may help prevent a RLF that may be caused by time consuming beam switching procedure.

At 622, when any one of the widened beams has a better SNR (or other figure of merit), (618) ("C"), the UE may start the refinement procedure on all the widened beams. For example, when any of the beams have a better SNR (or other figure of merit), (618) ("C"), the UE (356; 368; 359; FIGS. 8-9, 808; 810, FIG. 9; 904) may start the refinement procedure on all the widened beams. For example, beams the UE may be refine the antenna beam of the apparatus for wireless communication for a widened antenna beam when the parameter for that widened beam satisfies a threshold value. The direction and/or width of the beam may be systematically changed and measured to determine whether one or more narrower beams within the coverage area of the widened beam have an increased SNR ratio or some other figure of merit that is improved using the widened beam.

At 624, the UE may loop through all the narrower beams on the newly changed beam. For example, the UE (356; 368; 359; FIGS. 8-9, 808; 810, FIG. 9; 904) may loop through all the narrower beams 508, 510 on the newly changed beam.

The UE may perform measurement on each of the narrower beams and record SNR values. For example, the UE (356; 368; 359; FIGS. 8-9, 808; 810, FIG. 9; 904) may perform measurement on each of the narrower beams 508, 510 and record SNR values.

At 628, the UE may determine whether any of the narrower beams have a better SNR. For example, the UE (356; 368; 359; FIGS. 8-9, 808; 810, FIG. 9; 904) may determine whether any of the narrower beam 508, 510 post a better SNR (or other figure of merit).

At 630, the UE may choose a best one of the narrower beams as the next beam candidate when any of the narrower beam post a better SNR (or other figure of merit). For example, the UE (356; 368; 359; FIGS. 8-9, 808; 810, FIG. 9; 904) may choose the narrower beam with the highest SNR as the next beam candidate of the narrower beams that post a better SNR (or other figure of merit).

At 632, the UE may continue to use the same beam as further beam refinement is not going to yield better SNR. For example, the UE (356; 368; 359; FIGS. 8-9, 808; 810, FIG. 9; 904) may continue to use the same beam 508, 510 as further beam refinement is not going to yield better SNR (or other figure of merit).

Figure 7:
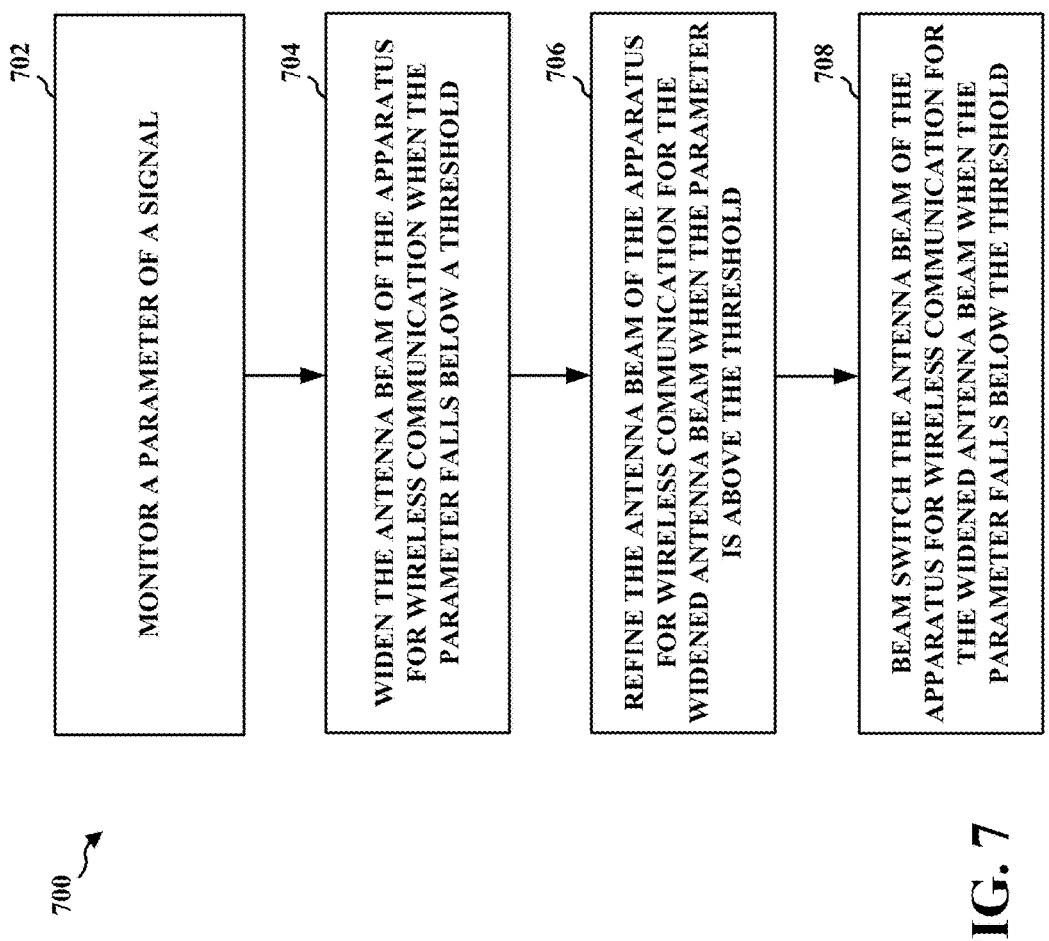
FIG. 7 is a flowchart of a method of wireless communication.

FIG. 7 is a flowchart 700 of a method of wireless communication. The method may be performed by a UE (e.g., the UE 104, 350, 404, 502, the apparatus 802/802'). At 702, the UE may monitor a parameter of a signal, e.g., a received signal. For example, the UE (e.g., the UE 104, 350, 404, 502, the apparatus 802/802') monitors a parameter of a signal. The UE may monitor, for example, SNR, signal-to-noise-plus interference ratio (SNIR), signal-to-interference ratio (SIR), peak SNR (PSNR), bit-error-rate (BER), or other figures of merit for a communication system. Accordingly, in an aspect, the parameter may include at least one of SNR, SNIR, SIR, PSNR, SINR, or BER. The UE may also, for example, compare the figure of merit used (e.g., SNR, SNIR, SIR, PSNR, BER) to a threshold.

At 704, the UE may widen the antenna beam of the apparatus for wireless communication when the parameter does not satisfy a threshold. For example, the UE (e.g., the UE 104, 350, 404, 502, the apparatus 802/802') widens the antenna beam (e.g., 404a-d) of the apparatus for wireless communication (e.g., 404) when the parameter (e.g., SNR, SNIR, SIRP, SNR, BER) does not satisfy a threshold, e.g., is below the threshold. An antenna beam may be widened based on changing signals transmitted to an antenna array such that transmissions from the antenna array result in a wider antenna beam pattern.

At 706, the UE may refine the antenna beam of the apparatus for wireless communication for the widened antenna beam when the parameter satisfies the threshold. For example, the UE (e.g., the UE 104, 350, 404, 502, the apparatus 802/802') refines the antenna beam (e.g., 404a-d) of the apparatus for wireless communication (e.g., 404) for the widened antenna beam (e.g., 404a-d) when the parameter (e.g., SNR, SNIR, SIR, PSNR, BER) satisfies the threshold, e.g., is above the threshold. In an aspect, refining the antenna beam (e.g., 404a-d) may include monitoring the parameter (e.g., SNR, SNIR, SIR, PSNR, BER) of the signal for a plurality of narrower antenna beams (e.g., 404a-d) that are within the widened antenna beam (e.g., 404a-d) and selecting at least one of the plurality of narrower antenna beams (e.g., 404a-d).

At 708, the UE may beam switch the antenna beam of the apparatus for wireless communication for the widened antenna beam when the parameter falls below the threshold, e.g., the UE may change beam from the widened beam to another antenna beam. For example, the UE (e.g., the UE 104, 350, 404, 502, the apparatus 802/802') beam switches (e.g., switches between beams 404a-d) the antenna beam (404a-d) of the apparatus for wireless communication (e.g., 404) for the widened antenna beam (404a-d) when the parameter (e.g., SNR, SNIR, SIR, PSNR, BER) falls below the threshold. In an aspect, beam switching (e.g., switches between beams 404a-d) the antenna beam (e.g., beams 404a-d) of the apparatus for wireless communication (e.g., 404) may occur after the antenna beam (e.g., beams 404a-d) has been widened to a predetermined maximum, e.g., a maximum width that an antenna (or array of antennas) on a particular UE is capable of being set to or some other predetermined antenna beam width. In an aspect, widening the antenna beam (e.g., beams 404a-d) to the predetermined maximum occurs after widening the antenna beam (e.g., beams 404a-d) a plurality of times based on monitoring the parameter (e.g., SNR, SNIR, SIR, PSNR, BER) of a signal. In an aspect, beam switching the antenna beam may include changing a direction of the widened antenna beam, for example, by switching antenna beams to a different antenna beam.

FIG. 8 is a conceptual data flow diagram 800 illustrating the data flow between different means/components in an exemplary apparatus 802. The apparatus may be a UE. The apparatus includes an antenna array 804 that may receive information 852 or transmit information 854 to or from a base station 850, a reception component 806 that receives the information 856 from the antenna array 804, a monitoring component 808 that monitors a figure of merit 858 related to the receive signal, e.g., such as SNR, and a beam control component 810 that receives a signal 860 from the monitoring component 808. The beam control component 810 may include sub-components to control beam width and/or beam switching to implement the systems and methods described herein. The beam control component 810 may transmit a control signal, e.g., a set of parameters for the antenna array 804 that adjusts one or more antenna beams based on the SNR 862 the antenna array 804 to adjust the beam width and beam direction, e.g., for beam switching, e.g., switching to a different antenna. Transmission component 812 may transmit information 864 to the antenna array 804, which may transmit information 854 to the base station 850.

The apparatus may include additional components that perform each of the blocks of the algorithm in the aforementioned flowcharts of FIGS. 6 and 7. As such, each block in the aforementioned flowcharts of FIGS. 6 and 7 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

FIG. 9 is a diagram 900 illustrating an example of a hardware implementation for an apparatus 802' employing a processing system 914. The processing system 914 may be implemented with a bus architecture, represented generally by the bus 924. The bus 924 may include any number of interconnecting buses and bridges depending on the specific application of the processing system 914 and the overall design constraints. The bus 924 links together various circuits including one or more processors and/or hardware components, represented by the processor 904, the components 804, 806, 808, 810, 812, and the computer-readable medium/memory 906. The bus 924 may also link various other circuits such as timing sources, peripherals, voltage regulators, and power management circuits, which are well known in the art, and therefore, will not be described any further.

The processing system 914 may be coupled to a transceiver 910. The transceiver 910 (e.g., reception component 806, transmission component 812) is coupled to one or more antennas 920 (e.g., antenna array 804). The transceiver 910 provides a means for communicating with various other apparatus over a transmission medium. The transceiver 910 receives a signal from the one or more antennas 920, extracts information from the received signal, and provides the extracted information to the processing system 914, specifically the reception component 806 may receive transmissions from a base station or another UE. In addition, the transceiver 910 receives information from the processing system 914, specifically the transmission component 812 may transmit information to the base station or another UE, and based on the received information, generates a signal to be applied to the one or more antennas 920. The processing system 914 includes a processor 904 coupled to a computer-readable medium/memory 906. The processor 904 is responsible for general processing, including the execution of software stored on the computer-readable medium/memory 906. The software, when executed by the processor 904, causes the processing system 914 to perform the various functions described supra for any particular apparatus. The computer-readable medium/memory 906 may also be used for storing data that is manipulated by the processor 904 when executing software. The processing system 914 further includes at least one of the components 804, 806, 808, 810, 812. The components may be software components running in the processor 904, resident/stored in the computer readable medium/memory 906, one or more hardware components coupled to the processor 904, or some combination thereof. The processing system 914 may be a component of the UE 350 and may include the memory 360 and/or at least one of the TX processor 368, the RX processor 356, and the controller/processor 359.

In one configuration, the apparatus 802/802' for wireless communication includes means for monitoring a parameter of a signal (e.g., 808), means for widening the antenna beam of the apparatus for wireless communication when the parameter falls below a threshold (e.g., 810, e.g., part of the beam width component), means for refining the antenna beam of the apparatus for wireless communication for the widened antenna beam when the parameter is above the threshold (e.g., 810, e.g., part of the beam width component), and/or means for beam switching the antenna beam of the apparatus for wireless communication for the widened antenna beam when the parameter falls below the threshold (e.g., 810, beam switching component). The aforementioned means may be one or more of the aforementioned components of the exemplary apparatus 802 and/or the processing system 914 of the apparatus 802' configured to perform the functions recited by the aforementioned means. As described supra, the processing system 914 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. An apparatus for wireless communication, comprising:
a processing system to manage an antenna beam, the processing system configured to:
monitor a parameter of a signal received on a first antenna beam;
widen the first antenna beam of the apparatus for wireless communication when the parameter does not satisfy a threshold; and
switch from the first antenna beam to a second antenna beam of the apparatus for wireless communication for the widened antenna beam when the parameter does not satisfy the threshold after the first antenna beam has been widened to a predetermined maximum.

2. The apparatus of claim 1, wherein the processing system is further configured to refine the widened antenna beam when the parameter satisfies the threshold.

3. The apparatus of claim 2, wherein refining the widened antenna beam comprises monitoring the parameter of the signal on each narrower antenna beam of a plurality of narrower antenna beams that are within the coverage area of the widened antenna beam and selecting at least one narrower antenna beam of the plurality of narrower antenna beams.

4. The apparatus of claim 2, wherein the parameter comprises at least one of signal-to-noise ratio (SNR), peak SNR (PSNR), signal-to-interference-plus-noise ratio (SINR), signal-to-interference ratio (SIR), or bit-error-rate (BER).

5. The apparatus of claim 1, wherein widening the first antenna beam to the predetermined maximum occurs after widening the first antenna beam a plurality of times based on monitoring the parameter of the received signal.

6. The apparatus of claim 1, wherein the beam switching the antenna beam comprises changing a direction of the widened antenna beam.

7. A method of wireless communication, comprising:
monitoring a parameter of a received signal;
widening an antenna beam when the parameter does not satisfy a threshold; and
beam switching the antenna beam for the widened antenna beam when the parameter does not satisfy the threshold after the first antenna beam has been widened to a predetermined maximum.

8. The method of claim 7, further comprising
refining the widened antenna beam when the parameter satisfies the threshold.

9. The method of claim 8, wherein the parameter comprises at least one of signal-to-noise ratio (SNR), peak SNR (PSNR), signal-to-interference-plus-noise ratio (SINR), signal-to-interference ratio (SIR), or bit-error-rate (BER).

10. The method of claim 7, wherein widening the antenna beam to the predetermined maximum occurs after widening the antenna beam a plurality of times based on monitoring the parameter of the received signal.

11. The method of claim 8, wherein refining the antenna beam comprises monitoring the parameter of the signal on each narrower antenna beam of a plurality of narrower antenna beams that are within the widened antenna beam and selecting at least one narrower antenna beam of the plurality of narrower antenna beams.

12. The method of claim 7, wherein the beam switching the antenna beam comprises changing a direction of the widened antenna beam.

13. A apparatus of wireless communication, comprising:
means for monitoring a parameter of a received signal;
means for widening an antenna beam when the parameter does not satisfy a threshold; and
means for beam switching the antenna beam of the apparatus for wireless communication for the widened antenna beam when the parameter does not satisfy the threshold after the first antenna beam has been widened to a predetermined maximum.

14. The apparatus of claim 13, further comprising means for refining the widened antenna beam when the parameter satisfies the threshold.

15. The apparatus of claim 14, wherein the parameter comprises at least one of signal-to-noise ratio (SNR), peak SNR (PSNR), signal-to-interference-plus-noise ratio (SINK), signal-to-interference ratio (SIR), or bit-error-rate (BER).

16. The apparatus of claim 13, wherein widening the antenna beam to the predetermined maximum occurs after widening the antenna beam a plurality of times based on monitoring the parameter of the received signal.

17. The apparatus of claim 14, wherein refining the antenna beam comprises monitoring the parameter of the signal on each narrower antenna beam of a plurality of narrower antenna beams that are within the widened antenna beam and selecting at least one narrower antenna beam of the plurality of narrower antenna beams.

18. The apparatus of claim 13, wherein the beam switching the antenna beam comprises changing a direction of the widened antenna beam.

19. A computer-readable medium storing computer executable code, comprising code to:
monitor a parameter of a received signal;
widen an antenna beam when the parameter does not satisfy a threshold; and
beam switching the antenna beam of the apparatus for wireless communication for the widened antenna beam when the parameter does not satisfy the threshold after the first antenna beam has been widened to a predetermined maximum.

* * * * *